US011515141B2

(12) United States Patent
Nakayama (10) Patent No.: US 11,515,141 B2
(45) Date of Patent: Nov. 29, 2022

(54) CLEANING METHOD IN INSPECTION APPARATUS, AND THE INSPECTION APPARATUS

(71) Applicant: TOKYO ELECTRON LIMITED, Tokyo (JP)

(72) Inventor: Hiroyuki Nakayama, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 332 days.

(21) Appl. No.: 16/806,414

(22) Filed: Mar. 2, 2020

(65) Prior Publication Data
US 2020/0286728 A1    Sep. 10, 2020

(30) Foreign Application Priority Data

Mar. 4, 2019    (JP) .............................. JP2019-038332

(51) Int. Cl.
*H01L 21/00* (2006.01)
*H01L 21/02* (2006.01)
*H01L 21/324* (2006.01)
*B08B 5/02* (2006.01)
*G01R 31/26* (2020.01)
*H01L 21/66* (2006.01)

(52) U.S. Cl.
CPC .......... *H01L 21/02049* (2013.01); *B08B 5/02* (2013.01); *G01R 31/2601* (2013.01); *H01L 21/324* (2013.01); *H01L 22/14* (2013.01)

(58) Field of Classification Search
CPC . H01L 21/02049; H01L 21/324; H01L 22/14; B08B 5/02; G01R 31/2601
See application file for complete search history.

(56) References Cited

U.S. PATENT DOCUMENTS

| 2021/0213491 A1* | 7/2021 | Edwards ................ B33Y 40/20 |
| 2021/0239750 A1* | 8/2021 | Yuen .................. G01R 31/2635 |
| 2021/0255233 A1* | 8/2021 | Konishi ................. G05D 23/19 |

FOREIGN PATENT DOCUMENTS

| CN | 2152196 Y | 1/1994 |
| CN | 208495250 U | 2/2019 |
| JP | H11-183522 A | 7/1999 |
| JP | 2018-157131 A | 10/2018 |
| TW | 201841222 A | 11/2018 |

\* cited by examiner

*Primary Examiner* — Richard A Booth
(74) *Attorney, Agent, or Firm* — Nath, Goldberg & Meyer; Jerald L. Meyer; Tanya E. Harkins (57) ABSTRACT

A cleaning method in an inspection apparatus that performs an electrical characteristic inspection on a device under test formed in an inspection object, includes: transferring, in a transfer process, a stage on which the inspection object is mounted to a position facing a probe card having probes, the probes being brought into contact with the device under test during the electrical characteristic inspection; subsequently, exhausting and depressurizing a space between the probe card and the stage facing the probe card in a peeling-off preparation process; introducing a gas into the space which has been depressurized and peeling off foreign substances adhering to a front surface of the stage and the probes in a foreign substance peeling-off process; and exhausting the space to discharge the foreign substances while continuously introducing the gas into the space in a foreign substance discharging process.

9 Claims, 7 Drawing Sheets

CLEANING METHOD IN INSPECTION APPARATUS, AND THE INSPECTION APPARATUS

CROSS-REFERENCE TO RELATED APPLICATION

This application is based upon and claims the benefit of priority from Japanese Patent Application No. 2019-038332, filed on Mar. 4, 2019, the entire contents of which are incorporated herein by reference.

TECHNICAL FIELD

The present disclosure relates to a cleaning method in an inspection apparatus, and the inspection apparatus.

BACKGROUND

A cleaning method disclosed in Patent document 1 is a method of cleaning a front surface of a stage on which a wafer is to be mounted by using a cleaning-purpose wafer mounted on the stage. In this method, a gas supply port and a gas discharge port are provided on the front surface of the stage. The cleaning-purpose wafer has a plate-shaped body, and an intake/exhaust passage provided in the body, through which a gas is supplied from the gas supply port and the supplied gas is discharged to the gas discharge port. Further, dust adhering to the front surface of the stage is removed through the supply of the gas to the intake/exhaust passage and the discharge of the gas from the intake/exhaust passage.

PRIOR ART DOCUMENT

Patent Documents

Patent Document 1: Japanese Laid-Open Patent Publication No. 2018-157131

SUMMARY

According to an embodiment of the present disclosure, there is provided a cleaning method in an inspection apparatus that performs an electrical characteristic inspection on a device under test formed in an inspection object, the cleaning method including: transferring, in a transfer process, a stage on which the inspection object is mounted to a position facing a probe card having probes, the probes being brought into contact with the device under test during the electrical characteristic inspection; subsequently, exhausting and depressurizing a space between the probe card and the stage facing the probe card in a peeling-off preparation process; introducing a gas into the space which has been depressurized and peeling off foreign substances adhering to a front surface of the stage and the probes in a foreign substance peeling-off process; and exhausting the space to discharge the foreign substances while continuously introducing the gas into the space in a foreign substance discharging process.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

In a semiconductor manufacturing process, a plurality of semiconductor devices having a predetermined circuit pattern is formed on a semiconductor wafer (hereinafter, referred to as a "wafer"). The semiconductor devices thus formed are subjected to an inspection such as an inspection of electrical characteristics and sorted into good-quality products and defective products. For example, the inspection of the semiconductor devices are performed using an inspection apparatus called a prober or the like in a state before the wafer is divided into individual semiconductor devices.

The inspection apparatus includes a stage on which the wafer is mounted, and a probe card having a plurality of probes. The probe card is provided above the wafer mounted on the stage. During the inspection of electrical characteristics, first, the probe card and the wafer approach each other so that the probes of the probe card are brought into contact with respective electrodes of the semiconductor devices formed on the wafer. In this state, electric signals are supplied to the respective semiconductor devices from a test head provided above the probe card through the respective probes. Further, the semiconductor devices are sorted into good-quality products and defective products, based on the electrical signals received by the test head from the semiconductor devices through the respective probes.

In a recent inspection apparatus, a heating part or a cooling part is provided in a stage on which a wafer is mounted so as to enable inspection of electrical characteristics of the electronic devices at a high temperature or a low temperature.

Recently, when inspecting electrical characteristics of semiconductor devices, a temperature of the stage has been adjusted by a refrigerant passage or a heater provided inside the stage, thereby adjusting a temperature of the wafer mounted on the stage so as to reproduce a mounting environment of the semiconductor devices.

In the above-described inspection apparatus, problem is generated if foreign substances are present on the stage. For example, in a case where the temperature of the wafer is required to be adjusted, if foreign substances are present on the stage, the transfer of heat from the stage to the wafer is hindered. This makes it impossible to adjust the temperature of the wafer to a desired temperature. In addition, if foreign substances are present on the stage, the wafer may be warped. Accordingly, it is necessary to clean the stage of the inspection apparatus at a predetermined timing.

Patent document 1 discloses a method of cleaning a stage by using a cleaning-purpose wafer mounted on the stage on which a wafer is to be mounted. In this method, a gas supply port and a gas discharge port are provided on a front surface of the stage. The cleaning-purpose wafer has a plate-shaped body, and an intake/exhaust passage provided in the body, through which a gas is supplied from the gas supply port and the supplied gas is discharged to the gas discharge port. Further, dust adhering to the front surface of the stage is removed through the supply of the gas to the intake/exhaust passage and the discharge of the gas from the intake/exhaust passage. That is, the stage is cleaned by using the cleaning-purpose wafer that is mounted on the stage and utilizes the gas supply port and the gas discharge port provided on the stage.

Meanwhile, it is also necessary to clean the probes during the inspection. This is because foreign substances adhering to the probes may degrade inspection quality, namely cause poor conductivity.

Therefore, the technology according to the present disclosure makes it possible to clean not only the stage inside the inspection apparatus but also the probes.

Hereinafter, an inspection apparatus and an inspection method according to the present embodiments will be described with reference to the drawings. Further, in the subject specification and the drawings, components having substantially identical functions and configurations will be designated by like reference numerals with duplicate descriptions thereof omitted.

First Embodiment

Figure 1:
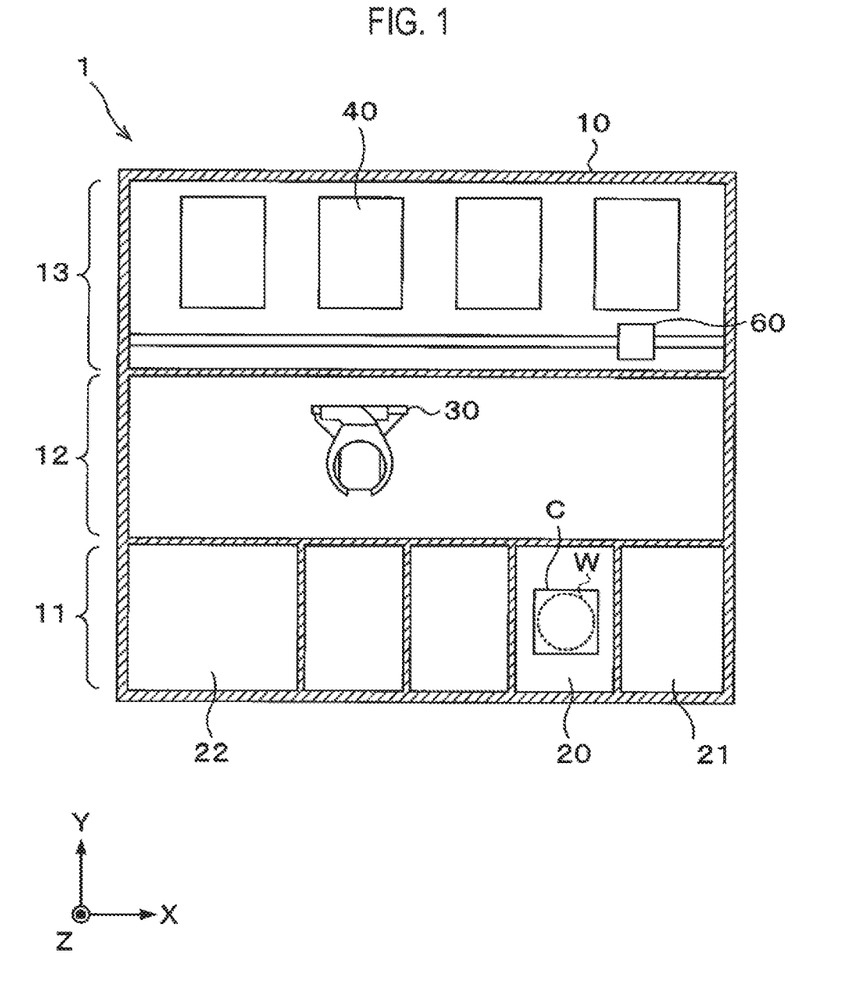
FIG. 1 is a horizontal cross-sectional view schematically illustrating a configuration of an inspection apparatus according to a first embodiment.
Figure 2:
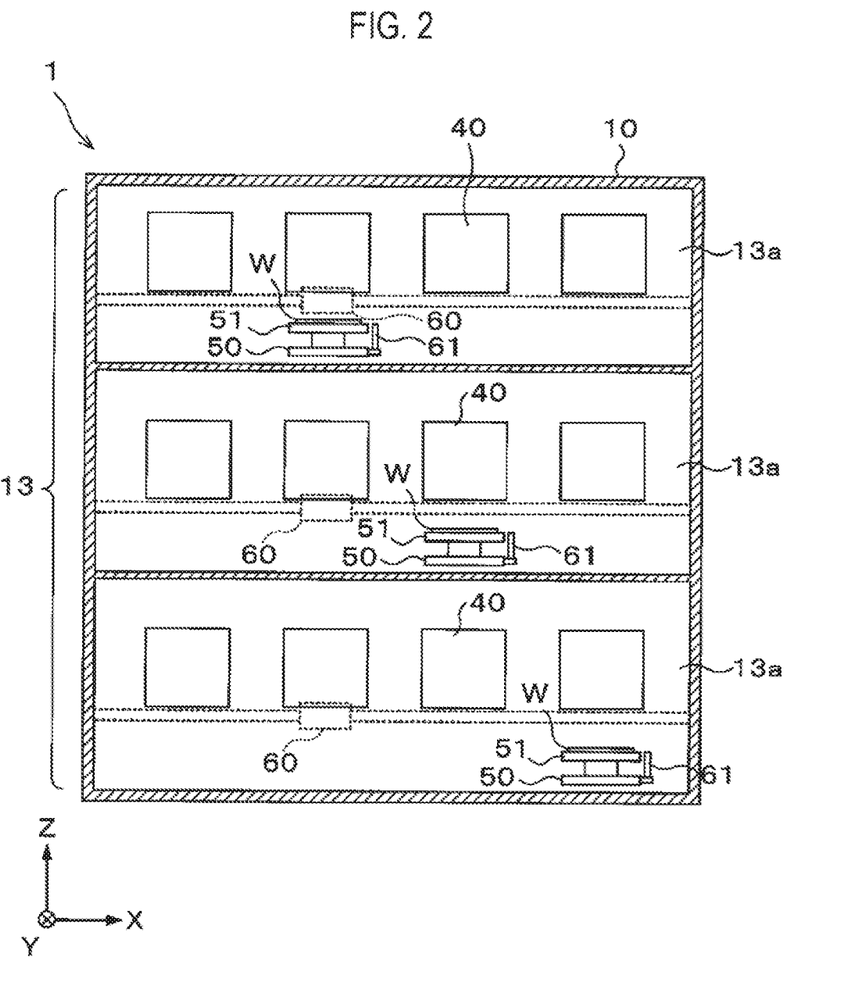
FIG. 2 is a vertical cross-sectional view schematically illustrating the configuration of the inspection apparatus according to the first embodiment.

FIGS. 1 and 2 are a horizontal cross-sectional view and a vertical cross-sectional view, respectively, that schematically illustrate a configuration of an inspection apparatus according to a first embodiment.

As illustrated in FIGS. 1 and 2, an inspection apparatus 1 includes a housing 10. The housing 10 is provided with a loading/unloading section 11, a transfer section 12, and an inspection section 13. The loading/unloading section 11 is a section through which a wafer W as an object to be inspected is loaded into or unloaded from the inspection apparatus 1. The transfer section 12 is a section that connects the loading/unloading section 11 and the inspection section 13. The inspection section 13 is a section in which electrical characteristics of semiconductor devices formed in the wafer W, which are devices under test, are inspected.

The loading/unloading section 11 is provided with a port 20 that receives a cassette C accommodating a plurality of wafers W, a loader 21 that accommodates a probe card (to be described later), and a controller 22 that controls each component of the inspection apparatus 1. The controller 22 may include a computer provided with a CPU, a memory and the like, and has a program storage part (not illustrated). A program for controlling various processes of the inspection apparatus 1 is stored in the program storage part. Further, the program may be recorded in a non-transitory computer-readable recording medium, and may be installed on the controller 22 from the recording medium. A portion or the entirety of the program may be realized by a dedicated hardware (a circuit board).

A transfer device 30 configured to be movable while holding the wafer W and the like is disposed in the transfer section 12. The transfer device 30 transfers the wafer W between the cassette C inside the port 20 of the loading/unloading section 11 and the inspection section 13. Further, among probe cards fixed to a pogo frame (to be described later) inside the inspection section 13, the transfer device 30 transfers one that requires maintenance to the loader 21 of the loading/unloading section 11. Further, the transfer device 30 transfers a new probe card or the maintained probe card, from the loader 21 to the respective pogo frame inside the inspection section 13.

A plurality of testers 40 is provided in the inspection section 13. Specifically, as illustrated in FIG. 2, the inspection section 13 is divided into three regions in a vertical direction. Each of the divided regions 13a is provided with a tester row including four testers 40 aligned in a horizontal direction (X direction in FIG. 2). Further, each of the divided regions 13a is provided with one aligner 50 and one camera 60. Further, the numbers and alignment of the testers 40, the aligners 50, and the cameras 60 may be arbitrarily selected.

The tester 40 transmits or receives an electric signal for inspecting electrical characteristics to or from the wafer W.

The aligner 50 is provided to move a chuck top 51 as a stage on which the wafer W is mounted and held by suction or the like, and is configured to move in an area below the tester 40. Specifically, the aligner 50 is configured to move in an up-down direction (Z direction in FIG. 2), a front-back direction (Y direction in FIG. 2), and a left-right direction (X direction in FIG. 2) while holding the chuck top 51. Accordingly, the aligner 50 functions as a position adjusting mechanism that performs position adjustment between the chuck top 51 and the probe card. Further, the aligner 50 includes a camera 61 that is configured to detachably hold the chuck top 51 by vacuum suction or the like and capture an image of the probe card.

The camera 60 is horizontally moved, and is located in front of each tester 40 inside the divided region 13a in which the camera 60 is provided, to capture an image of the wafer W mounted on the chuck top 51 on the aligner 50.

By cooperation of the camera 60 and the camera 61, the probes of the probe card and electrode pads of the semiconductor devices formed on the wafer W may be aligned with each other.

In the inspection apparatus 1, while the transfer device 30 transfers one wafer W toward one tester 40, another tester 40 may inspect the electrical characteristics of electronic devices formed on another wafer W.

Figure 3:
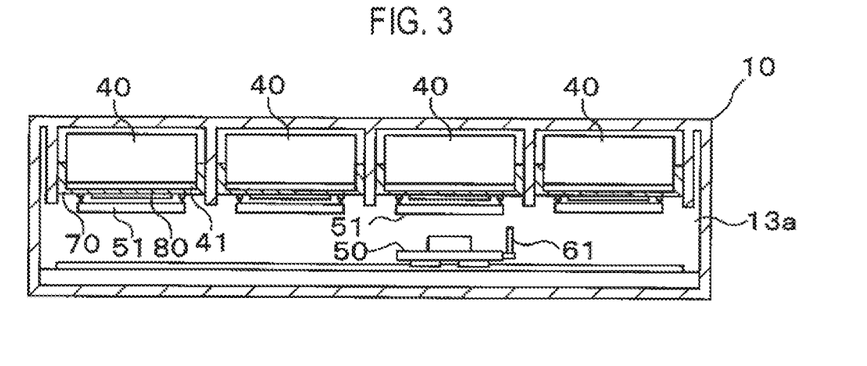
FIG. 3 is a vertical cross-sectional view illustrating a configuration of each divided region.
Figure 4:
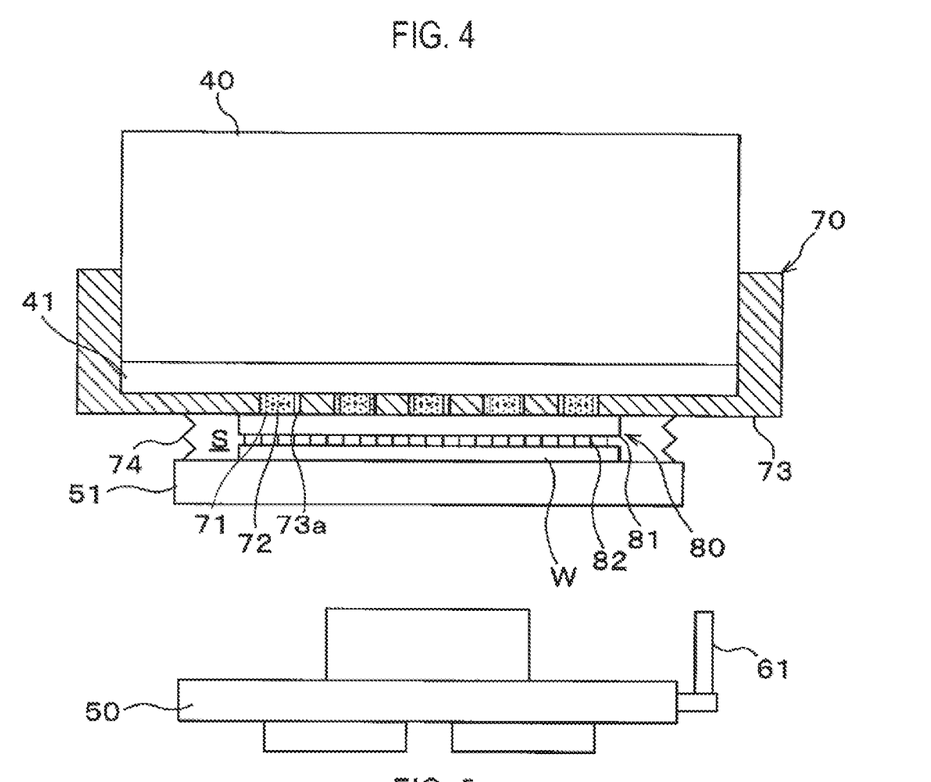
FIG. 4 is a partially enlarged view of FIG. 3.

Next, a configuration of the vicinity of the tester 40 will be described with reference to FIGS. 3 and 4. FIG. 3 is a vertical cross-sectional view illustrating an internal configuration of each divided region 13a. FIG. 4 is a partially enlarged view of FIG. 3.

As illustrated in FIGS. 3 and 4, the tester 40 includes a tester mother board 41 provided horizontally at a bottom portion of the tester 40. A plurality of inspection circuit boards (not illustrated) are installed upright on the tester mother board 41. Further, a plurality of electrodes is provided on a bottom surface of the tester mother board 41.

Further, a pogo frame 70 and a probe card 80 are provided below each of the testers 40 in this order from the top.

The pogo frame 70 is a card support part that supports the probe card 80 and electrically connects the probe card 80 and the tester 40. The pogo frame 70 is located between the tester 40 and the probe card 80. The pogo frame 70 has pogo pins 71 that electrically connect the tester 40 and the probe card 80. Specifically, the pogo frame 70 has a pogo block 72 that holds the plurality of pogo pins 71, and a frame body 73 having attachment holes 73a formed therein. When the pogo block 72 is inserted into the frame body 73, the pogo pins 71 are attached to the respective attachment holes 73a.

The probe card 80 is supported on a lower surface of the pogo frame 70 in a state in which the probe card 80 is aligned at a predetermined position of the lower surface.

A bellows 74 as a stage support part configured to be extendible in a vertical direction is installed on the lower surface of the pogo frame 70 to surround the attachment position of the probe card 80. During the electrical characteristic inspection, a closed space including the probe card 80 and the wafer W can be formed by the bellows 74 in a state in which the wafer W on the chuck top 51 (to be described later) is brought into contact with probes 82 (to be described later) of the probe card 80. Further, a space between the probe card 80 and the chuck top 51 can be closed by the bellows 74 during the cleaning process.

Further, by an exhaust mechanism (not illustrated), the pogo frame 70 is vacuum-suctioned to the tester mother board 41, and the probe card 80 is vacuum-suctioned to the pogo frame 70. By virtue of a vacuum-suction force for performing the vacuum suction, lower ends of the pogo pins 71 of the pogo frame 70 are brought into contact with respective electrode pads on an upper surface of a card body (to be described later) of the probe card 80, and upper ends of the pogo pins 71 are pushed toward respective electrodes of a lower surface of the tester mother board 41.

The probe card 80 includes a disk-shaped card body 81, a plurality of electrode pads (not illustrated) provided on an upper surface of the card body 81, and the probes 82 which are a plurality of needle-shaped terminals extending downward from a lower surface of the card body 81. The above-described plurality of electrodes provided on the upper surface of the card body 81 are electrically connected to the respective probes 82. Further, during the inspection, the probes 82 are respectively brought into contact with electrode pads or soldering bumps of the semiconductor devices formed in the wafer W. Accordingly, during the electrical characteristic inspection, electric signals related to the inspection are transmitted and received between the tester mother board 41 and the semiconductor devices on the wafer W through the pogo pins 71, the electrodes provided on the upper surface of the card body 81, and the probes 82.

During the electrical characteristic inspection, the chuck top 51 on which the wafer W is mounted is lifted up by the aligner 50 so that the probes 82 of the probe card 80 and the wafer W are brought into contact with each other. During the electrical characteristic inspection or the like, as the chuck top 51 is lifted up, the lower surface of the bellows 74 is brought into close contact with the chuck 51 by a sealing member (not illustrated) so that an inspection space S defined by the chuck top 51, the pogo frame 70, and the bellows 74 becomes a closed space. The inspection space S is evacuated and the holding of the chuck top 51 by the aligner 50 is released. The aligner 50 is moved downward to separate the chuck top 51 from the aligner 50. The chuck top 51 is attached to the pogo frame 70.

In the inspection apparatus 1 configured as above, if there is a tester 40 that is not performing an electrical characteristic inspection, a cleaning process is performed in the inspection space S corresponding to the respective tester 40. In the cleaning process, for example, the chuck top 51 and the probes 82 become cleaning targets.

Figure 5:
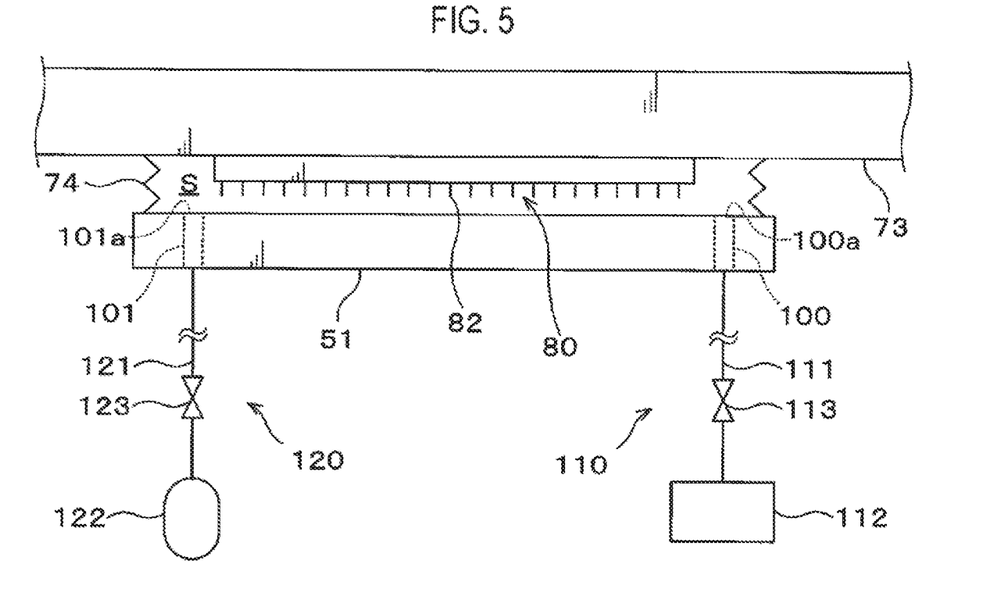
FIG. 5 is a side view of a chuck top.
Figure 6:
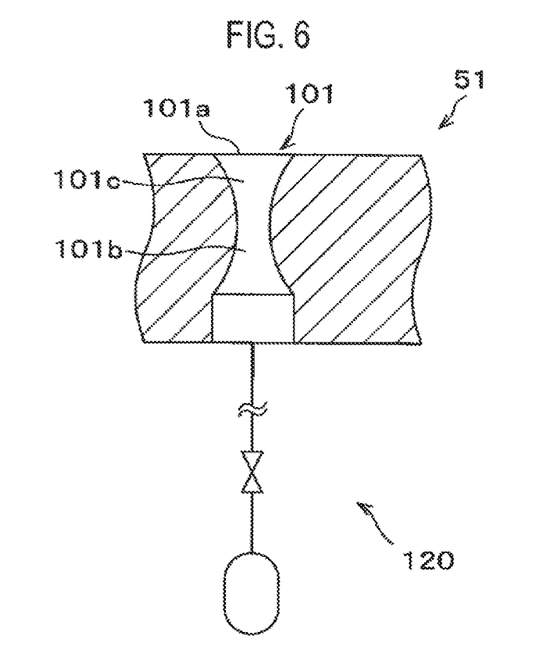
FIG. 6 is a partially enlarged cross-sectional view of the chuck top.
Figure 7:
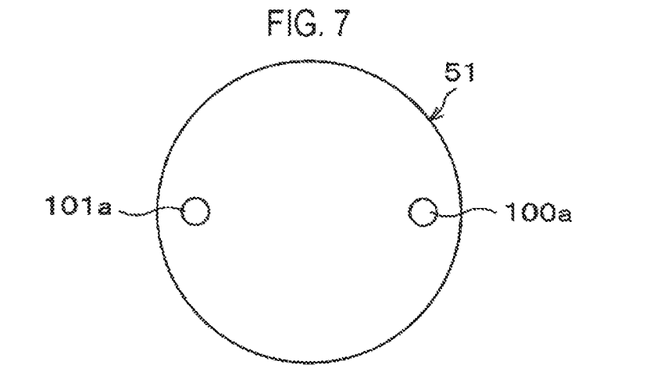
FIG. 7 is a top view of the chuck top.

Next, a configuration related to the cleaning process in the inspection apparatus 1 will be described. FIG. 5 is a side view illustrating a state of the chuck top 51 during the cleaning process, and illustrates the chuck top 51 in a state in which the chuck top 51 is supported by the pogo frame 70. FIG. 6 is a partially enlarged sectional view of the chuck top 51, and FIG. 7 is a top view of the chuck top 51.

During the electrical characteristic inspection, the wafer W is accommodated in the inspection space S defined by the chuck top 51 and the like. Meanwhile, during the cleaning process of cleaning the chuck top 51 as a cleaning target, as illustrated in FIG. 5, the wafer W is not accommodated in the inspection space S including the chuck top 51.

An exhaust passage 100 and an introduction passage 101 are formed in the chuck top 51.

The exhaust passage 100 may be formed, for example, to penetrate through the chuck top 51 in the vertical direction. An upper end of the exhaust passage 100 constitutes an exhaust port 100a exposed to the inspection space S, and a lower end thereof is connected to one end portion of an exhaust pipe 111 of an exhaust mechanism 110. The other end portion of the exhaust pipe 111 is connected to an exhaust device 112 of the exhaust mechanism 110. Further, the exhaust device 112 may include, for example, a vacuum pump. Further, in the exhaust mechanism 110, an opening/closing valve 113 that closes and opens the exhaust pipe 111 is provided on an upstream side of the exhaust device 112 in the exhaust pipe 111. With this configuration, the inspection space S can be exhausted and depressurized through the exhaust port 100a.

The introduction passage 101 may be provided, for example, to penetrate through the chuck top 51 in the vertical direction. An upper end of the introduction passage 101 constitutes an introduction port 101a exposed to the inspection space S, and a lower end thereof is connected to one end portion of a supply pipe 121 of a gas supply mechanism 120. The other end portion of the supply pipe 121 is connected to a source 122 of dry air. Further, an opening/closing valve 123 that closes or opens the supply pipe 121 is provided on a downstream side of the source 122 in the supply pipe 121. With this configuration, by introducing the dry air through the introduction port 101a into the inspection space S which has been depressurized by the exhaust through the exhaust port 100a, it is possible to generate a shock wave for peeling off foreign substances adhering to the front surface of the chuck top 51 and the probes 82, which are cleaning targets. The foreign substances peeled off by the shock wave is discharged through the exhaust port 100a.

Specifically, as illustrated in FIG. 6, the introduction passage 101 has a Laval nozzle structure. The Laval nozzle structure is a structure having a reduced portion 101b at the upstream side and an expanded portion 101c at the downstream side. The reduced portion 101b has a passage which gradually becomes smaller from an upstream end, and the expanded portion 101b has a passage which continuously extends from the reduced portion 101b and gradually becomes larger toward a downstream end. The internal pressure of the inspection space S and the introduction pressure of the dry air are appropriately set by suitably setting lengths of the reduced portion 101b and the expanded portion 101c, and inner diameters of the thinnest portion of the introduction passage 101, the downstream end (the introduction port 101a), and the upstream end. Thus, an ultrasonic flow of the dry air can be ejected into the inspection space S.

The ultrasonic flow of the dry air introduced from the introduction port 101a generates a shock wave. The shock wave propagates along surfaces of the members that define the inspection space S. Specifically, for example, the shock wave (namely, a surface having an abruptly-changing pressure) generated by the ultrasonic flow of the dry air may propagate from the lower surface of the pogo frame 70 toward the front surface of the chuck top 51 via the lower surface of the probe card 80 including the probes 82 and an inner wall surface of the bellows 74, or may propagate from the lower surface of the pogo frame 70 toward the front surface of the chuck top 51 only via the inner wall surface of the bellows 74.

Further, the ultrasonic flow of dry air from the introduction port 101a may collide with the probes 82 according to a position of the introduction port 101a.

Further, as the ultrasonic flow of dry air is introduced from the introduction port 101a, the shock wave may be generated around the introduction port 101a. In this case, the shock wave may propagate in the inspection space S and reach the front surface of the chuck top 51 or the probes 82. The shock wave reaching the front surface of the chuck top 51 or the like may reach the probes 82 via the inner wall surface of the bellows 74. The shock wave reaching the probes 82 or the like may reach the front surface of the chuck top 51 via the inner wall surface of the bellows 74.

By the above-described shock wave or the ultrasonic flow of dry air itself, the foreign substances adhering to the front surface of the chuck top 51 or the probes 82 are peeled off.

The exhaust passage 100 and the introduction passage 101 are formed such that, as illustrated in FIG. 7, the exhaust port 100a and the introduction port 101a are located in a peripheral portion of the chuck top 51 when viewed from the top. In the example of FIG. 7, the introduction port 101a is provided at a position facing the exhaust port 100a with the central portion of the chuck top 51 interposed between the introduction port 101a and the exhaust port 10a when viewed from the top.

Further, the exhaust device 112 and the opening/closing valve 113 of the exhaust mechanism 110, or the source 122 and the opening/closing valve 123 of the gas supply mechanism 120 may be provided outside the housing 10.

Next, a series of processes including the inspection process in relation to one tester 40 of the inspection apparatus 1 will be described.

(Wafer Loading)

First, the transfer device 30 is controlled to take out the wafer W from the cassette C in the port 20 of the loading/unloading section 11, load the wafer W into the inspection section 13, and mount the wafer W on the chuck top 51 held by the aligner 50.

(Position Alignment and Support of Chuck Top 51 on which Wafer W is Mounted)

Subsequently, the chuck top 51 on which the wafer W is mounted is aligned with respect to the probes 82 of the probe card 80, separated from the aligner 50, and supported by the pogo frame 70. Specifically, the aligner 50 including the camera 61 and the camera 60 are controlled such that the wafer W on the chuck top 51 and the probe card 80 are aligned with each other in the horizontal direction. Subsequently, the chuck top 51 is lifted up by the aligner 50 so that the electrodes of the semiconductor devices formed on the wafer W on the chuck top 51 and the probes 82 are brought into contact with each other, and the inspection space S defined by the chuck top 51, the pogo frame 70, and the bellows 74 is formed. The inspection space S becomes a closed space. Thereafter, the inspection space S is evacuated to have a predetermined pressure (pressure at the time of inspection). The holding of the chuck top 51 by the aligner 50 is released and the aligner 50 is lowered. Accordingly, the probes 82 are pressed against the electrodes of the wafer W at a predetermined amount of strength. The chuck top 51 is separated from the aligner 50 and is supported by the pogo frame 70. Further, the exhaust mechanism and the exhaust passage for evacuating the inspection space S to have the pressure at the time of inspection may be provided separately from the exhaust mechanism 110 and the exhaust passage 100 described above.

(Electrical Characteristic Inspection)

Subsequently, in the state in which the chuck top 51 and the aligner 50 are separated from each other, the electrical characteristic inspection of the semiconductor devices is performed while adjusting the temperature of the chuck top 51 to a preset temperature. The electric signals for the electrical characteristic inspection are inputted from the tester 40 to the semiconductor devices through the pogo pins 71 or the probes 82.

(Detachment (De-Chucking) Chuck Top 51)

After the electrical characteristic inspection is completed, the chuck top 51 having the wafer W mounted thereon is detached from the pogo frame 70. Specifically, the aligner 50 is controlled to be brought into contact with the chuck top 51. The evacuation of the inspection space S is ceased and dry air is introduced into the inspection space S so that the chuck top 51 is detached from the pogo frame 70 and is mounted and held on the aligner 50. The gas supply mechanism and the introduction passage for the de-chucking may be provided separately from the gas supply mechanism 120 and the introduction passage 101 described above.

(Wafer Unloading)

Subsequently, the aligner 50, the transfer device 30 and the like are controlled such that the wafer W is unloaded from the inspection section 13 and is returned to the cassette C in the port 20.

(Cleaning Process)

Subsequently, after the electrical characteristic inspection is completed, the chuck top 51 having no wafer W mounted thereon is transferred to a position facing the probe card 80 such that the chuck top 51 and the like are subjected to the cleaning process. The cleaning process will be described below.

After the cleaning process is completed, a process relating to one tester 40 of the inspection apparatus 1 returns to the wafer loading process in which a subsequent wafer W to be inspected target is loaded.

Although the cleaning process above has been described to be executed for each wafer W, the execution timing is not limited thereto. For example, the cleaning process may be executed whenever predetermined sheets of (for example, two or more) wafers W are inspected. In some embodiments, foreign substances on the front surface of the chuck top 51 or the probes 82 may be recognized based on the image capture results of the camera 60 and the camera 61. The cleaning process may be performed only when the foreign substances are recognized.

Figure 8:
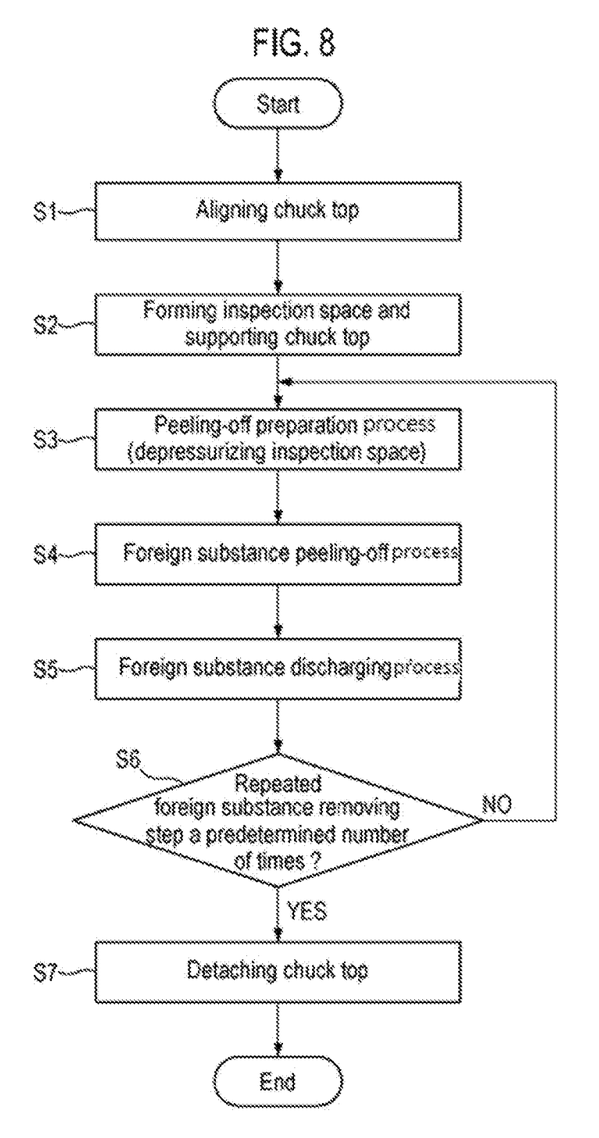
FIG. 8 is a flowchart for explaining an example of a cleaning process used in the inspection apparatus according to the first embodiment.
Figure 9:
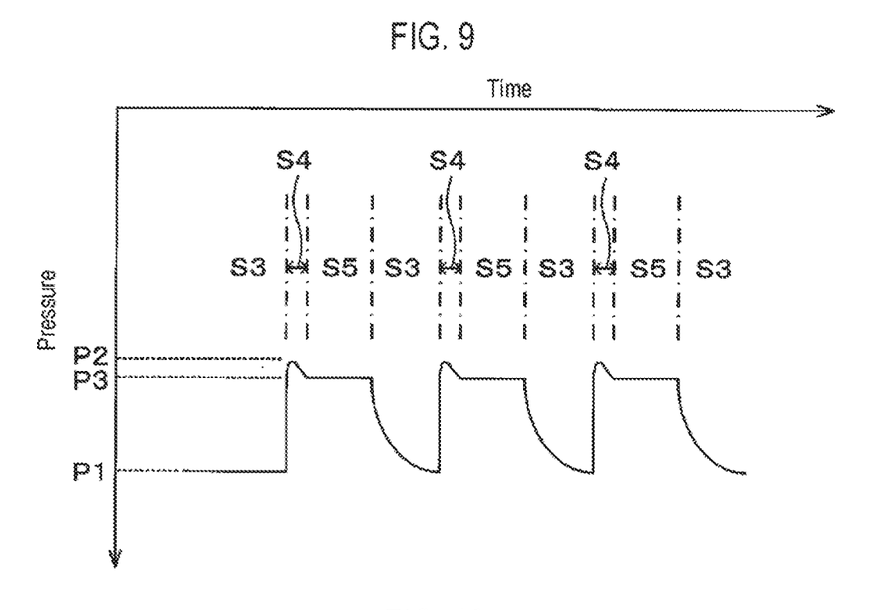
FIG. 9 is a view illustrating a time-dependent change in pressure of an inspection space during the cleaning process.

Next, an example of the cleaning process in the inspection apparatus 1 will be described with reference to FIGS. 8 and 9. FIG. 8 is a flowchart for explaining an example of the cleaning process in the inspection apparatus 1. FIG. 9 is a view illustrating a time-dependent change in pressure of the inspection space S during the cleaning process.

In the cleaning process of the inspection apparatus 1, first, as illustrated in FIG. 8, the chuck top 51 on which no wafer W is mounted thereon is aligned with respect to the probe card 80 (step S1). Specifically, the aligner 50 is controlled such that the chuck top 51 on which no wafer W is mounted thereon and the probe card 80 are aligned with each other in the horizontal direction.

Subsequently, the inspection space S is formed and the chuck top 51 is supported by the pogo frame 70 (step S2). Specifically, the aligner 50 is controlled such that the chuck top 51 is lifted up, and the inspection space S defined by the chuck top 51, the pogo frame 70, and the bellows 74 is formed. The inspection space S becomes a closed space. Subsequently, the opening/closing valve 113 of the exhaust pipe 111 is opened to start the exhaust of the inspection space S. At the same time, the holding of the chuck top 51 by the aligner 50 is released and the aligner 50 is lowered. Thus, the chuck top 51 is separated from the aligner 50 and is supported by the pogo frame 70.

Subsequently, the exhaust of the inspection space S is maintained and the inspection space S is depressurized such that foreign substances are peeled off in a foreign substance peeling-off process as a next process (step S3). Specifically, as illustrated in FIG. 9, the inspection space S is depressurized to a target pressure P1 or less in the state where the opening/closing valve 113 remains opened. Further, when the opening/closing valve 113 is opened, the opening/closing valve 123 provided in the supply pipe 121 is closed. Further, the target pressure P1 in this peeling-off preparation process is 380 Torr or less, for example, 1 Torr, such that the ultrasonic flow of dry air is generated when the dry air is introduced at a pressure of an atmospheric pressure level in the foreign substance peeling-off process as a next process. However, in order to avoid contact between the front surface of the chuck top 51 and the probes 82, the target pressure P1 may be set at such a level that the contact does not occur in the peeling-off preparation process.

After the depressurization of the inspection space S, the dry air is introduced into the inspection space S, and the foreign substances adhering to the front surface of the chuck top 51 and the probes 82 are peeled off (step S4). Specifically, for example, the opening/closing valve 123 provided in the supply pipe 121 is opened, and the dry air having a pressure of an atmospheric pressure level is supplied to the introduction passage 101. The ultrasonic flow of the dry air is ejected from the introduction port 101a into the inspection space S by a difference between the final pressure of the inspection space S in the peeling-off preparation process and the introduction pressure of the dry air. By the shock wave generated by the ultrasonic flow itself of the dry air or the introduction of the ultrasonic flow of the dry air, the foreign substances adhering to the front surface of the chuck top 51 and the probes 82 are peeled off. Further, by the introduction of the dry air, the pressure of the inspection space S is temporarily increased to a pressure P2 (for example, 30 Torr).

After the peeling-off of the foreign substances, the introduction of the dry air into the inspection space S and the exhaust of the inspection space S are maintained such that the foreign substances peeled off from the front surface of the chuck top 51 and the probes 82 are discharged from the inspection space S through the exhaust port 100a (step S5). Specifically, for example, for a predetermined period of time since the opening/closing valve 123 of the supply pipe 121 is opened, the opening/closing valve 123 and the opening/closing valve 113 are maintained in the opened state, and the introduction of the dry air from the introduction port 101a into the inspection space S and the exhaust of the dry gas from the inspection space S through the exhaust port 100a are continued. By introducing the dry air into the depressurized inspection space S, a gas flow which is oriented to the exhaust port 100a is generated in addition to the shock wave. The foreign substances peeled off in the foreign substance peeling-off process S4 move to the exhaust port 100a by the viscosity of the gas flow, and are discharged through the exhaust port 100a. Further, in this step S4, the pressure of the inspection space S is gradually reduced. However, the flow rate of the dry air and the exhaust capability of the exhaust mechanism 110 may be set such that the lowest pressure P3 in this step becomes 4 Torr or more.

Hereinafter, the peeling-off preparation process S3, the foreign substance peeling-off process S4, and the foreign substance discharging process S5 will be collectively referred to as a foreign substance removing process.

Subsequently, after the foreign substance removing process, it is determined by the controller 22 whether the foreign substance removing process has been repeated a predetermined number of times (two times or more) (step S6).

If it is determined that the foreign substance removing process has not been repeated the predetermined number of times (NO), the process returns to step S3 where the foreign substance removing process is performed again. In other words, the term "the foreign substance removing process is repeated" refers to supplying the dry air in a pulse-like manner into the inspection space S while exhausting the inspection space S at a predetermined exhaust rate.

If it is determined that the foreign substance removing process has been performed the predetermined number of times (YES), the chuck top 51 is detached from the pogo frame 70 (step S7). Specifically, the aligner 50 is controlled to be brought into contact with the chuck top 51. Subsequently, the opening/closing valve 113 of the exhaust pipe 111 is closed to stop the exhaust of the inspection space S. The opening/closing valve 123 of the supply pipe 121 is continuously maintained in the opened state to continuously introduce the dry air into the inspection space S, and the chuck top 51 is detached from the pogo frame 70. The detached chuck top 51 is mounted and held on the aligner 50.

In the manner, the cleaning process in the inspection apparatus 1 and with respect to one inspection space S is completed.

Further, the foreign substance peeling-off process S4 is performed for 1 second to 5 seconds. The foreign substance discharging process S5 is performed for 20 seconds to 30 seconds. The peeling-off preparation process S3 is performed for a period of time corresponding to the exhaust capability of the exhaust mechanism 110.

As described above, the cleaning method according to the present embodiment includes the peeling-off preparation process of exhausting and depressurizing the inspection space S, namely a space between the probe card 80 and the chuck 51 facing the probe card 80, the foreign substance peeling-off process of peeling off the foreign substances adhering to the front surface of the chuck top 51 and the probes 82 by introducing dry air into the depressurized inspection space S. and the foreign substance discharging process of discharging the foreign substances by exhausting the inspection space S while maintaining the introduction of the dry air into the inspection space S. Accordingly, according to the present embodiment, the probes 82 as well as the chuck top 51 in the inspection apparatus 1 can be cleaned. Unlike the embodiment, in a case where the cleaning of the probes 82 is performed by polishing, the probes 82 may be worn away. However, in the present embodiment, since such polishing is not necessary for the cleaning of the probes 82, the probes 82 are not worn away. Further, according to the present embodiment, the cleaning of the chuck top 51 and the probes 82 does not require manual effort. This eliminates the need to stop the inspection apparatus 1 during the cleaning process, thus preventing the operation time of the inspection apparatus 1 from being shortened.

Further, according to the present embodiment, in addition to the chuck top 51 and the probes 82, other members facing the inspection space S can also be cleaned. For example, the card body 81, the bellows 74, and the pogo frame 70 can also be cleaned.

Further, by performing a process that is similar to the above-described cleaning process in the state where the wafer W is mounted on the chuck top 51, it is possible to clean the wafer W instead of the chuck top 51. Further, a timing of performing cleaning of the wafer W may be for each wafer W. Further, the execution timing may be determined based on the image capture result of the wafer W obtained by the camera 60. For example, the cleaning may be performed in a case in which an error is generated in recognizing an alignment mark or pad on the wafer W based on the image capture result obtained by the camera 60. This is because foreign substances are deemed to be present on the alignment mark or the pad on the wafer W. In some embodiments, foreign substances on the front surface of the wafer W may be recognized based on the image capture result obtained by the camera 60. The cleaning process of the respective wafer W may be performed only when the foreign substances are recognized.

Further, in the present embodiment, as described above, the foreign substance removing process (the combination of the peeling-off preparation process, the foreign substance peeling-off process, and the foreign substance discharging process) is performed repeatedly. Thus, the foreign substances adhering to the front surface of the chuck top 51 and the probes 82 can be removed in a more reliable manner. In some embodiments, the number of performing the foreign substance removing process may be one.

Further, in the present embodiment, the foreign substance removing process is performed repeatedly a predetermined number of times. However, the foreign substance removing step may be repeated until foreign substances are not detected by a sensor that is provided in the exhaust pipe 111 to detect foreign substances.

Further, in the present embodiment, as described above, the introduction passage 101 having the introduction port 101*a* provided on the upper end thereof and through which the dry air is introduced has a Laval nozzle structure. Accordingly, the ultrasonic flow of the dry air can be ejected from the introduction port 101*a* into the depressurized inspection space S. Through the shock wave generated by the ejection, the foreign substances adhering to the front surface of the chuck top 51 and the probes 82 can be peeled off. Meanwhile, in a case where the dry air introduced from the introduction port 101*a* does not form an ultrasonic flow, a layer (boundary layer) composed of a gas flow having a speed of zero may be generated on the front surface of the chuck top 51 or the like. This may make it impossible to remove the foreign substances. In contrast, in the present embodiment, the shock wave is generated. Thus, a gas flow of a non-zero speed is formed over an entire area of a cleaning target such as the chuck top 51 to the vicinity of the front surface thereof. Accordingly, the foreign substances adhering to the front surface of the chuck top 51 and the probes 82 can be removed in a more reliable manner.

The temperature of the dry air introduced into the inspection space S in the foreign substance peeling-off step or the foreign substance discharging step may be different from the temperature of the chuck top 51. The reason for this is as follows. The heat capacity of the foreign substances adhering to the chuck top 51 is lower than that of the chuck top 51. Thus, the introduction of the dry air having a temperature differing from that of the chuck top 51 as described above substantially changes only the temperature of the foreign substances. Accordingly, due to a difference between thermal expansion coefficients of the foreign substances and the chuck top 51, it becomes easy to peel off the foreign substances from the cleaning target.

Further, in order to make the temperature of the dry air different from that of the chuck top 51, the temperature of the chuck top 51 may be adjusted by a temperature adjusting mechanism (not illustrated) provided for the chuck top 51, and the temperature of the dry air may be adjusted by a temperature adjusting mechanism provided for the dry air.

Although in the above embodiment, dry air has been described as being used as a gas introduced into the inspection space S during the cleaning process, the present disclosure is not limited thereto. For example, the dry gas may be an inert gas such as a nitrogen gas. Alternatively, a gas with a large molecular weight such as an Ar gas or the like may be used as the dry gas. The use of the gas with a large molecular weight increases the kinetic energy of the gas for peeling off the foreign substances. It is therefore possible to peel off the foreign substance in a more reliable manner.

Further, the flow rate of the dry air introduced into the inspection space S during the cleaning process may be larger than that of the dry air introduced into the inspection space S in the de-chucking step of the chuck top 51 immediately after the electrical characteristic inspection. The reason for this is because, by introducing the dry air at the flow rate, which is larger than that of the dry gas supplied in the de-chucking step, into the inspection space S during the cleaning process, it is possible to remove the foreign substances in advance during the cleaning process by the dry air with the flow rate used in the de-chucking step.

In some embodiments, the exhaust mechanism 110 and the exhaust passage 100 may be used in common with another exhaust mechanism and another exhaust passage used in the inspection apparatus 1. For example, the exhaust mechanism 110 and the exhaust passage 100 may be used in common with an exhaust mechanism or an exhaust passage for evacuating even the pressure of the inspection space S during the inspection.

Further, in some embodiments, the gas supply mechanism 120 and the introduction passage 101 may be used in common with another gas supply mechanism and another introduction passage used in the inspection apparatus 1. For example, the gas supply mechanism 120 and the introduction passage 101 may be used in common with a gas supply mechanism and an introduction passage for performing the de-chucking step immediately after the electrical characteristic inspection.

Second Embodiment

Figure 10:
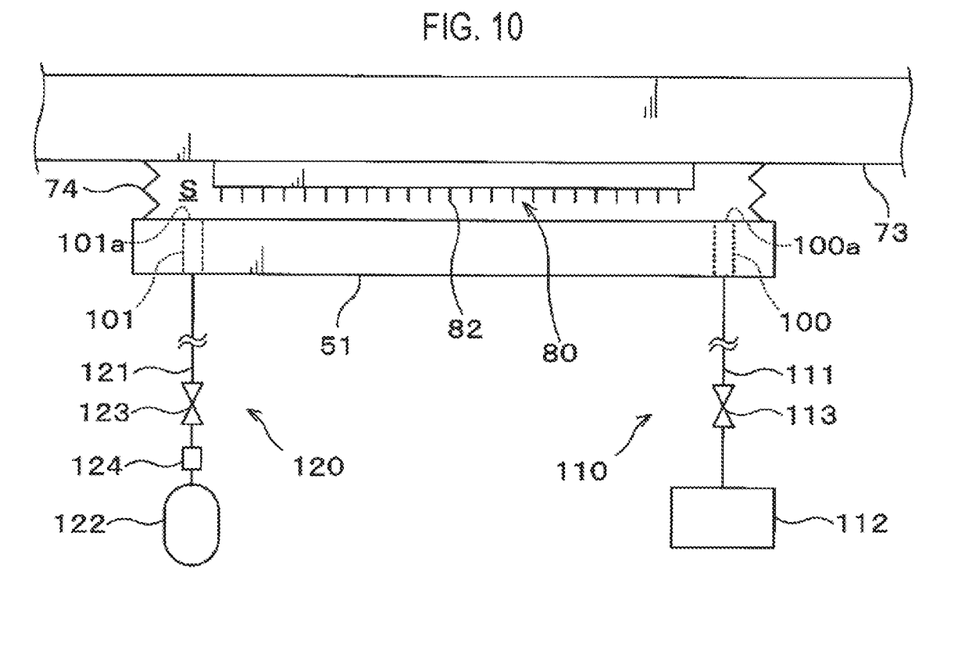
FIG. 10 is an explanatory view showing a gas supply mechanism used for a cleaning process in an inspection apparatus according to a second embodiment.

FIG. 10 is a view for explaining a gas supply mechanism used for a cleaning process in an inspection apparatus according to a second embodiment.

In this embodiment, a flow rate adjusting part 124 is provided between the source 122 and the opening/closing valve 123 in the supply pipe 121 of the gas supply mechanism 120. The flow rate adjusting part 124 may include a member having an orifice structure, which is configured to limit a flow rate of the gas flowing to the downstream side, namely the inspection space S.

The cleaning process in this embodiment includes a bellows expanding/contracting step of varying an internal pressure of the inspection space S to expand or contract the bellows 74, and peeling off foreign substances adhering to the bellows 74. The variation of the internal pressure of the inspection space S in the bellows expanding/contracting step may be realized by adjusting a flow rate of the gas to be introduced into the inspection space S with the flow rate adjusting part 124.

The bellows expanding/contracting step may be performed simultaneously with the foreign substance removing step S5.

Further, the method of adjusting a flow rate of the gas to be introduced into the inspection space S is not limited to the above example in which the above-described flow rate adjusting part 124 is used. For example, a gas supply mechanism that is similar to the gas supply mechanism 120 may be additionally provided. A flow rate of the gas to be introduced into the inspection space S may be adjusted by introducing the gas from both the gas supply mechanism 120 and the additional gas supply mechanism, or introducing the gas from one of the gas supply mechanism 120 and the additional gas supply mechanism.

Although in the above example, the bellows 74 is expanded and contracted by adjusting the flow rate of the gas to be introduced into the inspection space S, the method of expanding and contracting the bellows 74 is not limited to the above example. For example, a pressure adjusting valve having a variable degree of opening, may be provided in the exhaust pipe 111 of the exhaust mechanism 110. The bellows 74 may be expanded and contracted by adjusting the degree of opening of the pressure adjusting valve to vary the internal pressure of the inspection space S.

(Another Example of Chuck Top 51)

Figure 11:
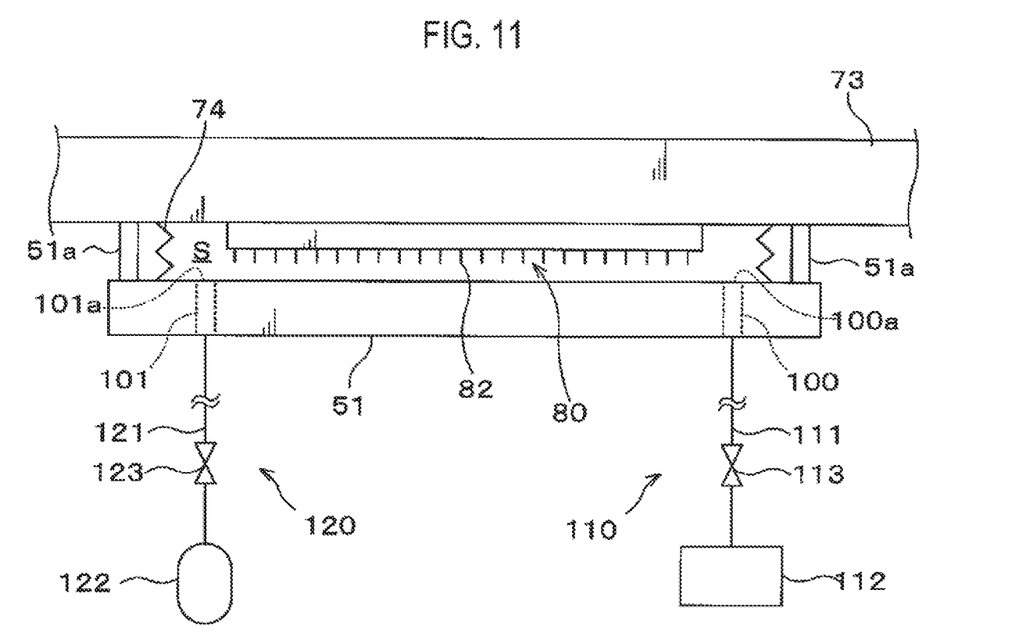
FIG. 11 is a side view illustrating another example of the chuck top.

FIG. 11 is a side view illustrating another example of the chuck top 51.

As illustrated in FIG. 11, the chuck top 51 of this example includes a contact preventing member 51a that is provided at an outer side of an area, in which the chuck top 51 is in contact with the bellows 74, and is configured to prevent the probes 82 from being brought into contact with the front surface of the chuck top 51 during the cleaning process.

The contact preventing member 51a may be a columnar member that protrudes upward from the front surface of the chuck top 51. The height of the contact preventing member 51a (that is, a protrusion degree of the contact preventing member 51a from the front surface of the chuck top 51) may be set to such an extent that, when the inspection space S is depressurized at the time of the cleaning process in which the chuck top 51 is included as a cleaning target, the contact between the probes 82 and the front surface of the chuck top 51 is hindered by allowing an upper end of the contact preventing member 51a to be brought into contact with the lower surface of the pogo frame 70. Alternatively, the height of the contact preventing member 51a may be set to such an extent that the contract between the front surface of the wafer W mounted on the chuck top 51 and the probes 82 is not hindered during the electrical characteristic inspection.

By providing the contact preventing member 51a, the contact between the probes 82 and the front surface of the chuck top 51 can be prevented in a more reliable manner during the cleaning process (specifically, in the peeling-off preparation step or the bellows expanding/contracting step).

Further, in the case where the contact preventing member 51a is provided, even though the internal pressure of the inspection space S in the peeling-off preparation step is low, the probes 82 and the front surface of the chuck top 51 are not brought into contact with each other. Accordingly, the difference between the introduction pressure of the dry air and the internal pressure of the inspection space S in the foreign substance peeling-off step can be increased, thus enabling performance of the introduction of the ultrasonic flow of the dry air into the inspection space S and the generation of the shock wave in a more reliable manner.

The contact preventing member 51a may be provided in the pogo frame 70.

Further, the height of the contact preventing member 51a may be configured to be varied. In particular, the height of the contact preventing member 51a may be varied when the cleaning process is performed on the wafer W. Alternatively, the contact preventing member 51a may include a retraction mechanism configured to move the contact preventing member 51a backward to avoid interference with the chuck top 51 during the electrical characteristic inspection. The reason for this is to allow the front surface of the wafer W to be brought into contact with the probes 82 during the electrical characteristic inspection while preventing the front surface of the wafer W from coming into contact with the probes 82 during the cleaning process.

Further, the contact preventing member 51a may be provided at an inner side of the area in which the contact preventing member 51a is in contact with the bellows 74.

(Another Example of Chuck Top 51)

Figure 12:
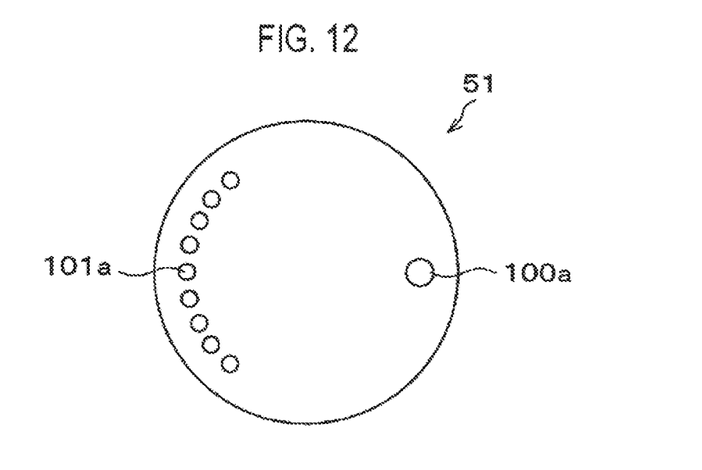
FIG. 12 is a side view illustrating another example of the chuck top.

FIG. 12 is a side view illustrating another example of the chuck top 51.

In the example of FIG. 7, the introduction port 101a provided on the chuck top 51 is one. In contrast, as illustrated in FIG. 12, a plurality of introduction ports 101a may be provided in the chuck top 51. Specifically, the plurality of introduction ports 101a are provided at regular intervals in a circumferential direction along a peripheral portion of the chuck top 51.

By forming the plurality of introduction ports 101a in this manner, it is possible to introduce a gas into the inspection space S more uniformly.

Further, in some embodiments, in the case where the plurality of introduction ports 101a are provided, the diameter of each introduction port 101a may be set to be small. By setting the diameter of each introduction port 101a to be small, pressure difference is likely to occur in the vicinity of an outlet of each introduction port 101a. Thus, a shock wave can be generated easily. Further, in the case where the introduction port 101a provided is one, if the diameter of the introduction port 101a is set to be small, a flow rate of the gas may not be secured. Thus, there is a concern that the internal pressure of the inspection space S may not attain a desired pressure (for example, a pressure whose a pressure ratio before and after pressure increase due to the introduction of the gas is 2 or more) in the foreign substance peeling-off step. However, the formation of the plurality of introduction ports prevents occurrence of such a problem.

Further, although in the above examples, the introduction port of the gas into the inspection space S and the exhaust port of the gas from the inspection space S are provided on the chuck top 51, they may be provided on the pogo frame 70 or the probe card 80.

Further, although in the above examples, the introduction port 101a provided on the chuck top 51 is provided at an outer side of an area in which the probes 82 are formed when viewed from the top, the introduction port 101a may be provided at an inner side of the area.

Further, the introduction passage 101 may be formed such that the gas introduced from the introduction port 101a is oriented toward the probes 82.

It should be noted that the embodiments disclosed herein are exemplary in all respects and are not restrictive. The above-described embodiments may be omitted, replaced or modified in various forms without departing from the scope and spirit of the appended claims.

The following configurations also belong to the technical scope of the present disclosure.

(1) A cleaning method in an inspection apparatus that performs an electrical characteristic inspection on a device under test formed in an inspection object, includes: transferring, in a transfer process, a stage on which the inspection object is mounted to a position facing a probe card having probes, the probes being brought into contact with the device under test during the electrical characteristic inspection; subsequently, exhausting and depressurizing a space between the probe card and the stage facing the probe card in a peeling-off preparation process, introducing a gas into the space which has been depressurized and peeling off foreign substances adhering to a front surface of the stage and the probes in a foreign substance peeling-off process; and exhausting the space to discharge the foreign substances while continuously introducing the gas into the space in a foreign substance discharging process.

According to item (1), it is possible to clean the probes as well as the stage in the inspection apparatus.

(2) In the cleaning method of item (1), the peeling-off preparation process, the foreign substance peeling-off process, and the foreign substance discharging process are repeated in a sequential order.

According to item (2), it is possible to remove the foreign substances adhering to the stage and the probes in a more reliable manner.

(3) In the cleaning method of item (1) or (2), the transfer process includes supporting the stage by a stage support part configured to be expanded and contracted, and closing the space by the stage support part. The cleaning method further includes expanding and contracting the stage support part in an expansion/contraction process.

According to item (3), it is possible to remove the foreign substances adhering to the stage support part.

(4) In the cleaning method of item (3), the expansion/contraction process includes varying an internal pressure of the space to expand and contract the stage support part.

(5) In the cleaning method of any one of items (1) to (4), at least one of the foreign substance peeling-off process and the foreign substance discharging process includes introducing the gas having a temperature different from that of the stage.

According to (5), it is possible to easily peel off the foreign substances from the front surface of the stage.

(6) In the cleaning method of any one of items (1) to (5), the foreign substance peeling-off process includes generating a shock wave through the introduction of the gas into the space which has been depressurized, and peeling off the foreign substances adhering to the front surface of the stage and the probes by the shock wave.

According to (6), it is possible to remove the foreign substances adhering to the stage and the probes in a more reliable manner.

(7) An inspection apparatus for performing an electrical characteristic inspection on a device under test formed in an inspection object, including: a stage on which the inspection object is mounted; and a controller configured to control an exhaust mechanism configured to exhaust a space between a probe card having probes and the stage, the probes being brought into contact with the device under test during the electrical characteristic inspection, and a gas supply mechanism configured to supply a gas into the space, wherein the controller controls the exhaust mechanism and the gas supply mechanism to perform: exhausting and depressurizing the space; introducing the gas into the space which has been depressurized and peeling off foreign substances adhering to a front surface of the stage and the probes; and exhausting the space to discharge the foreign substances while continuously introducing the gas into the space.

(8) The cleaning method of item (7) further includes a stage support part configured to be expanded and contracted, and configured to support the stage so as to close the space. The controller is configured to control at least one of the exhaust mechanism and the gas supply mechanism to expand and contract the stage support part by varying an internal pressure of the space.

(9) The cleaning method of item (7) or (8) further includes: a contact preventing member provided in at least one of a card support part configured to support the probe card and the stage, and configured to prevent the probes and the stage from being brought into contact with each other.

(10) In the cleaning method of any one of items (7) to (9), an introduction port through which the gas is introduced is provided on at least one of a card support part configured to support the probe card and the stage, and a passage having the introduction port at a distal end thereof has a Laval nozzle structure.

According to the present disclosure in some embodiments, it is possible to clean probes as well as a stage in an inspection apparatus.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A cleaning method in an inspection apparatus that performs an electrical characteristic inspection on a device under test formed in an inspection object, the cleaning method comprising:
   transferring, in a transfer process, a stage on which the inspection object is mounted to a position facing a probe card having probes, the probes being brought into contact with the device under test during the electrical characteristic inspection;
   subsequently, exhausting and depressurizing a space between the probe card and the stage facing the probe card in a peeling-off preparation process;

introducing a gas into the space which has been depressurized and peeling off foreign substances adhering to a front surface of the stage and the probes in a foreign substance peeling-off process; and exhausting the space to discharge the foreign substances while continuously introducing the gas into the space in a foreign substance discharging process.

2. The cleaning method of claim 1, wherein the peeling-off preparation process, the foreign substance peeling-off process, and the foreign substance discharging process are repeated in a sequential order.

3. The cleaning method of claim 2, wherein the transfer process includes supporting the stage by a stage support part configured to be expanded and contracted, and closing the space by the stage support part, and wherein the cleaning method further comprises expanding and contracting the stage support part in an expansion/contraction process.

4. The cleaning method of claim 3, wherein the expansion/contraction process includes varying an internal pressure of the space to expand and contract the stage support part.

5. The cleaning method of claim 4, wherein at least one of the foreign substance peeling-off process and the foreign substance discharging process includes introducing the gas having a temperature different from that of the stage.

6. The cleaning method of claim 5, wherein the foreign substance peeling-off process includes generating a shock wave through the introduction of the gas into the space which has been depressurized, and peeling off the foreign substances adhering to the front surface of the stage and the probes by the shock wave.

7. The cleaning method of claim 1, wherein the transfer process includes supporting the stage by a stage support part configured to be expanded and contracted, and closing the space by the stage support part, and wherein the cleaning method further comprises expanding and contracting the stage support part in an expansion/contraction process.

8. The cleaning method of claim 1, wherein at least one of the foreign substance peeling-off process and the foreign substance discharging process includes introducing the gas having a temperature different from that of the stage.

9. The cleaning method of claim 1, wherein the foreign substance peeling-off process includes generating a shock wave through the introduction of the gas into the space which has been depressurized, and peeling off the foreign substances adhering to the front surface of the stage and the probes by the shock wave.

* * * * *